United States Patent [19]

Chen

[11] Patent Number: 5,780,892
[45] Date of Patent: Jul. 14, 1998

[54] FLASH E²PROM CELL STRUCTURE WITH POLY FLOATING AND CONTROL GATES

[75] Inventor: Yi-Shi Chen, Hsinchu, Taiwan

[73] Assignee: Winbond Electronics Corporation, Hsinchu, Taiwan

[21] Appl. No.: 758,057

[22] Filed: Nov. 27, 1996

Related U.S. Application Data

[63] Continuation of Ser. No. 407,896, Mar. 21, 1995, abandoned.

[51] Int. Cl.⁶ ............................................. H01L 29/788
[52] U.S. Cl. ............................................. 257/317
[58] Field of Search ................................. 257/317

[56] References Cited

U.S. PATENT DOCUMENTS

| | | | |
|---|---|---|---|
| 4,274,012 | 6/1981 | Simko | 257/317 |
| 5,461,249 | 10/1995 | Ozara | 257/322 |
| 5,591,652 | 1/1997 | Matsushita | |
| 5,633,184 | 5/1997 | Tamura et al. | |

OTHER PUBLICATIONS

H.E. Maes, J. Withers & G. Groeseneken. "Trends in Non--Volatile Memory Devices and Technologies", Solid State Devices, pp. 157–168 (1988). no month.

*Primary Examiner*—Stephen Meier
*Attorney, Agent, or Firm*—Meltzer, Lippe, Goldstein, Wolf & Schlissel, P.C.

[57] ABSTRACT

A floating gate E²PROM cell is provided with a poly silicon floating gate having a pointed, sloped edge. A poly oxide is disposed on the pointed, sloped edge of the floating gate. A select gate is disposed on the poly oxide. The select gate overlaps the pointed, sloped edge of the floating gate. The floating gate, poly oxide, and select gate cooperate so that electrons tunnel according to enhanced Fowler Nordheim tunnelling from a point of the pointed, sloped edge of the floating gate, through the poly oxide and into the select gate.

A simple process is also provided for fabricating an E²PROM cell including the step of forming a nitride layer on a poly silicon layer. The nitride layer is patterned, using a photo-lithographic technique, to form an exposed poly silicon layer surface window. The exposed surface window of the poly silicon layer is then oxidized using a LOCOS (local oxidation of silicon) process to form a poly oxide region. The poly oxide region thus formed has a tapered edge which is adjacent to a pointed, sloped edge of a remaining non-oxidized poly silicon floating gate region of the poly silicon layer. A poly oxide layer is then formed on the poly silicon floating gate region. A select gate is then formed on the poly oxide layer so that it overlaps the pointed, sloped edge of the poly silicon floating gate.

9 Claims, 4 Drawing Sheets

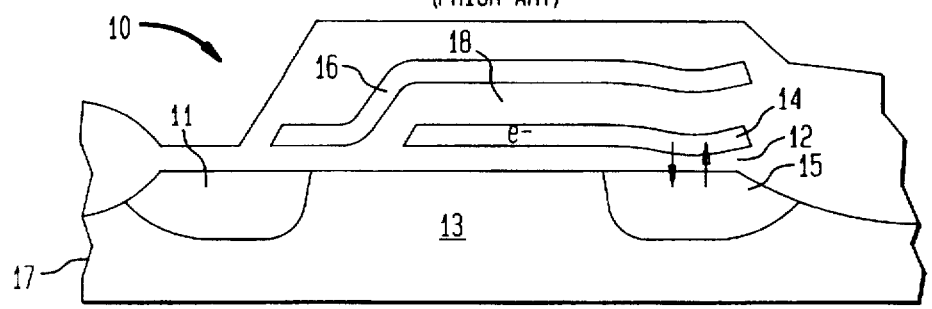
FIG. 1
(PRIOR ART)
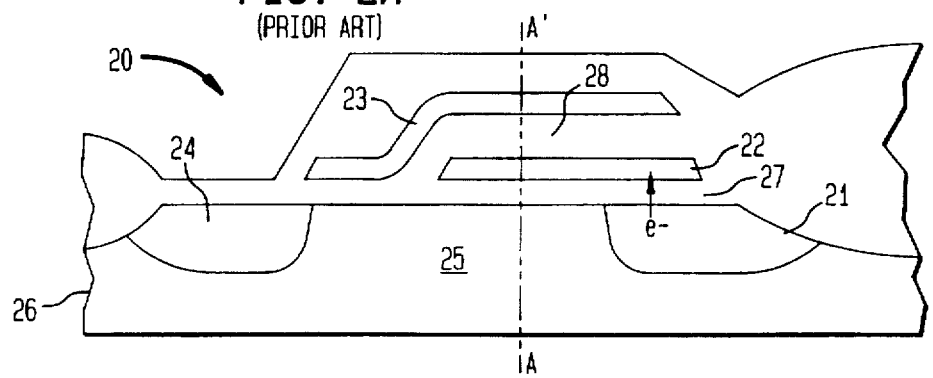
FIG. 2A
(PRIOR ART)
FIG. 2B
(PRIOR ART)
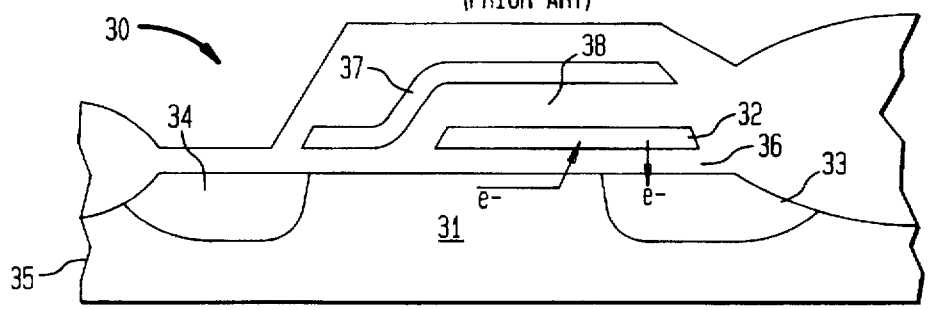
FIG. 3
(PRIOR ART)

5,780,892

FLASH E²PROM CELL STRUCTURE WITH POLY FLOATING AND CONTROL GATES this application is a continuation of application Ser. No. 08/407,896 filed Mar. 21, 1995, now abandoned.

FIELD OF THE INVENTION

The present invention is directed to a semiconductor floating gate E²PROM cell which is simple and self aligned. The inventive floating gate E²PROM cell also uses a low programming current, has a high programming/erase endurance and fast write and erase times.

BACKGROUND OF THE INVENTION

A floating gate erasable memory cell typically includes a field effect transistor, a floating gate positioned above the channel of the field effect transistor, and a select or control gate positioned at least partly over the floating gate. The floating and select gates are often made of poly-silicon. As indicated by its name, the floating gate is electrically isolated. For instance, the floating gate may be formed so that it is completely surrounded by oxide regions and layers. The cell is programmed by charging and discharging the floating gate.

Three classic programming mechanisms for floating gate erasable memories are Fowler-Nordheim (FN) tunnelling, enhanced FN tunnelling and channel hot electron (CHE) injection. See H. MAES, J. WITHERS & G. GROESENEKEN, Trends in Non-volatile Memory Devices and Technologies", SOLID STATE DEVICES page 157–168 (1988). In FN tunnelling, electrons tunnel from a Si region through an oxide layer (such as an $SiO_2$ layer which insulates the floating gate) and into the floating or select gate. Typically, a 10 Mega Volt/cm field is required to narrow the Si-$SiO_2$ barrier so that electrons can tunnel from the Si conduction band into the $SiO_2$.

In enhanced FN tunnelling, electrons tunnel from a poly silicon region through a textured poly oxide layer and into the floating or select gate. The poly silicon region from which the electrons tunnel has particles with asperities (pointed particles) at the poly silicon/poly oxide interface. The asperities enhance the field at the interface between the poly silicon region from which the electrons tunnel and the poly oxide layer through which the electrons tunnel. Thus, average fields on the order of 2 Mega Volts/cm produce a field on the order of 10 Mega Volts/cm at the poly silicon/poly oxide interface. However, this enhancement is only provided for one tunnelling direction, namely, the direction in which the asperities of the poly silicon point.

Channel hot electrons can be created in a high electric field near a drain junction. Such channel hot electrons can be injected from the channel into a floating gate. However, CHE cannot be used to remove electrons from a floating gate.

FIGS. 1–6 show six conventional flash E²PROM cell architectures 10, 20, 30, 40, 50 and 60 showing the different possible combinations of the above three programming mechanisms. Conventionally, many trade-offs are made in the design of flash memory E²PROM (electrically erasable programmable read-only memory) cells. Some cells are very simple to manufacture but are very large or difficult to scale. Other cells require only a low programming power (low power to write or erase information stored in a cell) but require more than one programming mechanism.

The floating gate tunnel oxide (FLOTOX) cell 10 is shown in FIG. 1 comprising a source 11, a drain 15, and a channel 13 formed in a substrate 17. A gate oxide 12 is formed on the channel 13 and a floating gate 14 is formed on the gate oxide 12. An oxide layer 18 is formed on the floating gate 14 and a select gate 16 is formed on the oxide layer 18. In a write operation (storing electrons in the floating gate 14), electrons tunnel according to FN tunnelling from the drain 15, through the thin oxide layer 12, to the floating gate 14. In an erase operation (removing electrons from the floating gate 14) electrons tunnel according to FN tunnelling from the floating gate 14, through the thin oxide layer 12, to the drain. The FLOTOX cell 10 is advantageous in that its manufacture is highly compatible with existing fabrication processes. The FLOTOX cell 10 also has a low development cost and can also be fabricated using a single poly silicon layer (for the gates 14 and 16). However, the FLOTOX cell 10 is disadvantageous because it is large, difficult to scale and is subject to a high defect density in the thin oxide layer 12.

The textured poly oxide-thin oxide (Tex-Thinox) cell 20 is shown in FIGS. 2A and 2B (FIG. 2B shows a cross-section along the line A–A'). A drain 21, a source 24 and a channel 25 are formed in a substrate 26. A poly oxide 27 is formed on the channel 25 and a poly silicon floating gate 22 is formed on the poly oxide 27. An oxide 28 is formed on the floating gate 22 and a select gate 23 is formed on the oxide 28. Writing is achieved by enhanced FN tunnelling from drain 21, through the poly oxide 27, to floating gate 22 as shown in FIG. 2A. Erasing is achieved by FN tunnelling from floating gate 22, through the oxide 28, to control gate 23 as shown in FIG. 2B. The Tex-Thinox cell 20 has the advantages of small cell size, easy scalability and low programming power requirements. The Tex-Thinox cell 10 is disadvantageous in that it is complex (as shown by the intricate geometrical shape of the gates 22 and 23 in the two views of FIG. 2A and FIG. 2B). The Tex-Thinox cell 20 is also susceptible to both defects in the thin oxide 28 separating the floating gate 22 and the drain 21 and wear out of the poly oxide 27 separating the floating gate 22 and the control gate 23.

The channel hot electron-thin oxide (CHE-Thinox) cell 30 is shown in FIG. 3 including a source 33, channel 31 and drain 34 formed in a substrate 35. A gate oxide 36 is formed on the channel 31 and a floating gate 32 is formed on the gate oxide 36. A select gate 37 is formed on an oxide layer 38 which, in turn, is formed on the floating gate 32. Writing is achieved by injection of channel hot electrons from the channel 31, across the gate oxide 36 and into the floating gate 32. Erasing is achieved by FN tunnelling from the floating gate 32, through the gate oxide 36, to the source 33. The CHE-Thinox cell 30 has the advantages of small cell size, simple construction and easy scalability. The disadvantages of the CHE-Thinox cell 30 are a low write/erase endurance and the requirement of a high programming power. Furthermore, the CHE-Thinox cell 30 is susceptible to defects in the thin gate oxide 36 and to CHE degradation.

The Thinox-Tex cell 40 is shown in FIG. 4. The Thinox-Tex cell 40 includes a source 44, a channel 41 and a drain 45 formed in a substrate 46. A gate oxide 47 is formed on the channel 41 and a poly silicon floating gate 42 is formed on the gate oxide 47. A poly oxide layer 48 is formed on the floating gate 42. A sidewall gate 43 and select gate 49 are formed on the poly oxide layer 48. Writing is achieved by FN tunnelling from channel 41, through the gate oxide 47, to floating gate 42. Erasing is achieved by enhanced FN tunnelling from floating gate 42, through the poly oxide 48, to sidewall gate 43. The Thinox-Tex cell 40 has a low programming power requirement. However, the Thinox-Tex cell 40 is large and is difficult to scale. The Thinox-Tex cell 40 is also susceptible to defects in the thin gate oxide 47 and wearing out of the poly oxide 48.

The textured poly floating gate (TPFG) cell 50 is shown in FIG. 5. The TPFG cell 50 has a source 54, a channel 57 and a drain 56 formed in a substrate 52. A sidewall gate 51, a floating gate 53 and a select gate 55 are formed in a thick poly oxide 58. Writing is achieved by enhanced FN tunnelling from the side wall gate 51, through the poly oxide 58, to the floating gate 53. Erasing is achieved by enhanced FN tunnelling from the floating gate 53, through the poly oxide 58, to the select gate 55. The TPFG cell 50 has the advantages of small size, low programming power, direct write ability and simple scalability. However, the TPFG cell 50 has the disadvantages of a highly complex design, a critical tunnel oxide requirement and a high programming voltage. This latter disadvantage renders the TPFG cell 50 susceptible to trap-up (the trapping of electrons in the oxide 58 during programming) and window variation.

The CHE-Tex cell 60 is shown in FIG. 6. The CHE-Tex cell 60 includes a source 64, a drain 65 and a channel 66 formed in a substrate 61. A gate oxide 67 is formed on the channel and a poly silicon floating gate is formed on the gate oxide 67. A poly oxide layer 68 is formed on the floating gate and a select gate 63 is formed on the poly oxide layer 68. Writing is achieved by CHE injection from the channel 66, across the gate oxide 67, and into the floating gate 62. Erasing is achieved by enhanced FN tunnelling from the floating gate 62, through the poly oxide layer 68, to the select gate 63. The CHE-Tex cell 60 is advantageous because it is small and is easily scaled. However, the CHE-Tex cell 60 requires a high programming power. Furthermore, the CHE-Tex cell is susceptible to wearing out of the poly oxide layer 68 and to CHE degradation.

An improved CHE injection cell is shown in FIG. 7 called a perpendicularly accelerating channel injection metal oxide semiconductor (PACMOS) cell 70. The PACMOS cell has a source 71, a drain 72 and a channel 73 formed in a substrate 79. A gate oxide layer 78 is formed over the channel 73 and a poly silicon floating gate 74 is formed on the gate oxide layer 78. A second oxide layer 75 is formed on the poly silicon floating gate 74 and a metal select gate 76 is formed over a portion of the second oxide layer 75 so that it partially overlaps the floating gate 74 and the drain portion of the channel 77 at which the hot electrons are generated. Writing is achieved by applying a voltage to the select gate 76 which is close to the threshold voltage and simultaneously biasing the floating gate 74 with a high voltage (via capacitive coupling from the drain 72). As a result, a strong potential drop occurs at the center of the channel 73 where neither of the gates 74 or 76 are controlling the channel 73. This provides a very efficient injection of CHE at the channel center, i.e., with an efficiency of $10^{-3}$ as opposed to $10^{-7}$ with other architectures. Erasing is achieved by FN tunnelling from the poly floating gate 74 through the second oxide layer 75 to the source 71. The PACMOS cell 70 has a very efficient writing mechanism. However, the PACMOS cell 70 is erased using a less efficient FN tunnelling mechanism through an oxide. A large erase current is therefore required and the gate oxide 75 is subject to defects.

None of the E²PROM cell architectures 10, 20, 30, 40 50, 60, and 70 provides an adequate combination of simple design, self alignment, low programming current and high write/erase endurance. It is therefore an object of the present invention to overcome the disadvantages of the prior art.

SUMMARY OF THE INVENTION

This and other objects are achieved by the present invention. According to one embodiment, a floating gate E²PROM cell is provided with a poly silicon floating gate having a pointed, sloped edge. A poly oxide layer is disposed on the pointed, sloped edge of the poly silicon floating gate. A select gate is disposed on the poly oxide layer. The select gate overlaps the pointed, sloped edge of the poly silicon floating gate. The poly silicon floating gate, poly oxide layer, and select gate cooperate so that electrons tunnel according to enhanced FN tunnelling from the pointed, sloped edge of the floating gate, through the poly oxide layer, and into the select gate during an erase operation. This is so because electrons stored in the poly floating gate tend to accumulate at the point of the sloped edge and tunnel therefrom. Thus, the possibility of wearing out the poly oxide by tangential electron flow across asperities of the poly silicon floating gate (at the poly silicon floating gate/poly oxide interface) is reduced.

Illustratively, the E²PROM cell further comprises a channel formed in the vicinity of the poly silicon floating gate. The channel is for injecting channel hot electrons into the poly silicon floating gate during a write operation. The channel illustratively has self-aligned source and drain regions formed at opposite ends. Illustratively, the channel operates according to the perpendicularly accelerating channel injection principle.

According to another embodiment, a simple process is provided for fabricating an E²PROM cell according to the invention. First, a poly silicon layer is formed on a substrate. Then, a nitride layer is formed on the poly silicon layer. The nitride layer is patterned, e.g., by a photo-lithographic technique, to form an exposed surface window of the poly silicon layer. The exposed surface window of the poly silicon layer is then oxidized, e.g., using a LOCOS (local oxidation of silicon) process to form a poly oxide region. The poly oxide region thus formed has a tapered edge which is adjacent to a pointed, sloped edge of a remaining non-oxidized region of the poly silicon layer. The non-oxidized poly silicon region thus formed is the poly silicon floating gate. A poly oxide layer is then formed on the poly silicon floating gate. A select gate is then formed on the poly oxide layer so that it overlaps the pointed, sloped edge of the poly silicon floating gate. The select gate may illustratively be formed by depositing a second poly silicon layer on the poly oxide and patterning the second poly silicon layer.

An E²PROM cell is therefore provided which has a simple design, is self aligned, requires low programming current and has a high write/erase endurance.

BRIEF DESCRIPTION OF THE DRAWING

FIG. 1 shows a conventional FLOTOX cell.

FIGS. 2A–2B show a conventional Tex-Thinox cell.

FIG. 3 shows a conventional CHE-Thinox cell.

DETAILED DESCRIPTION OF THE INVENTION

Figure 8A:
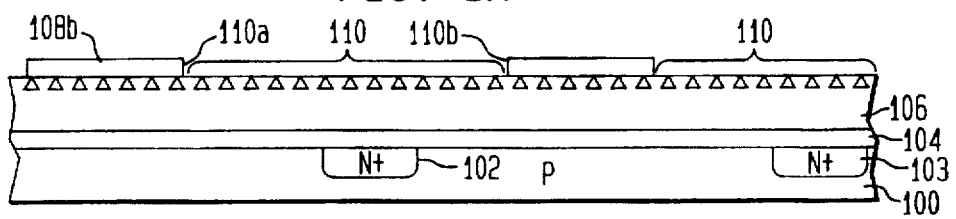
FIGS. 8(a)–(e) illustrates a process for fabricating an E²PROM cell according to one embodiment of the present invention.

FIGS. 8(a)–(e) illustrates a process for fabricating an E²PROM cell according to one embodiment of the present invention. As shown in FIG. 8(a), a source region 103 and a drain region 102 are formed in a substrate 100. The source and drain regions may be doped N⁺ with arsenic As and/or phosporous P at a concentration of $10^{21}$. The source and drain regions 103, 102 illustratively have a depth of 0.2 to 0.5 μm. Illustratively, the source 103 and drain 102 are formed in the substrate 100 simultaneously by the same diffusion or implantation step so that they are self aligned.

Next, a first gate oxide layer 104 is formed on the surface of the substrate 100. The gate oxide layer 104 illustratively has a thickness of 150 Å. A first poly silicon layer 106 is then formed on the first gate oxide layer 104. As shown in FIGS. 8(a)–(e), the poly silicon layer 106 (and poly silicon regions 114) has asperities, i.e., pointed particles, which are represented by triangles. These asperities point in the upward direction as shown. Illustratively, the poly silicon layer 106 has a thickness of 2000 Å and is doped N⁺ with phosporous P at a concentration of about $10^{15}$ to $10^{17}$. Thereafter, a nitride layer such as $Si_3N_4$ is formed on the poly silicon layer 106. Illustratively, the nitride layer has a thickness of 1000 Å to 3000 Å. The nitride layer is patterned using a photo-lithographic technique to form a number of nitride regions 108a, 108b adjacent to exposed windows 110 of the poly silicon layer 106. For example, the windows 110 may be rectangular with a length of 1.0 μm and width of 1.0 μm. Illustratively, the edges 110a and 110b of the window 110 approximately coincide with the desired edges of poly silicon floating gates to be formed in the poly silicon layer (as described below).

Figure 8B:
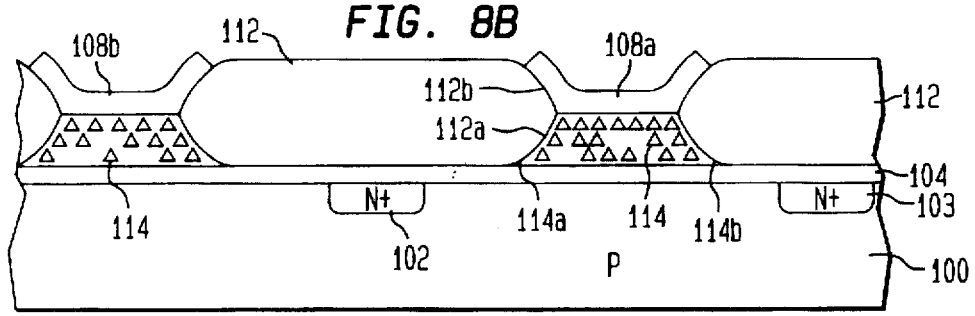

Next, in step (b) shown in FIG. 8(b), poly oxide regions 112 are formed in the poly silicon layer 106. Each poly oxide region 112 is formed approximately at an exposed surface window 110 of the poly silicon layer 106. This is illustratively achieved using a LOCOS process wherein heat is applied to the exposed surface window 110 for a certain period of time in the presence of oxygen. As shown, each poly oxide region 112 has tapered edges 112a and 112b. This is caused by the reduced oxygen flow to the portions of the poly silicon layer 106 under the nitride regions 108a and 108b. As a result of forming poly oxide regions 112 with tapered edges, poly silicon regions 114 are produced adjacent to the poly oxide regions 112. The poly silicon regions 114 thus formed have sloped edges 114a and 114b which taper to points 115a and 115b.

Figure 8C:
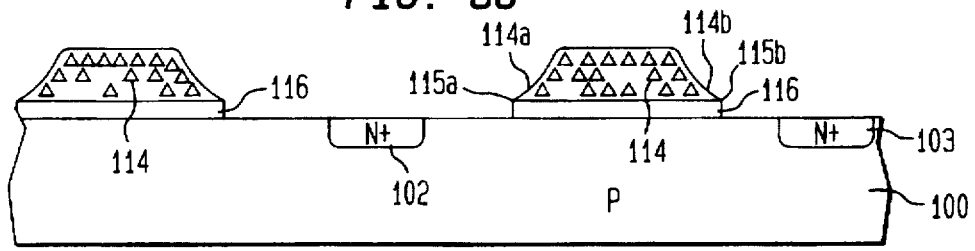
Figure 8D:
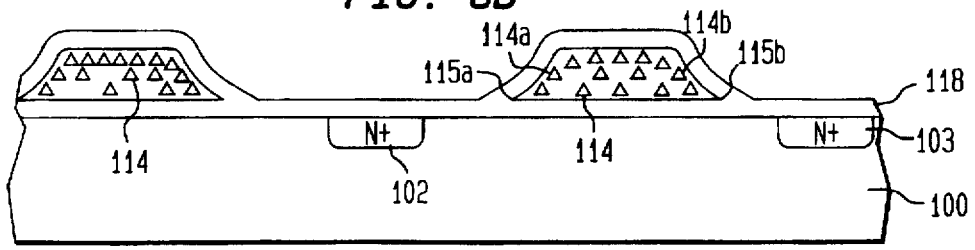

In step (c) shown in FIG. 8(c), the poly oxide regions 112 and nitride regions 108a and 108b are stripped thereby exposing the surface of the substrate 100 and poly silicon regions 114. Each poly silicon region 114 rests on a gate oxide region 116. Next in step (d) shown in FIG. 8(d), a poly oxide layer 118 is formed on the exposed surface of the substrate 100 and poly silicon regions 114. Illustratively, this poly oxide layer 118 has a thickness of 150 to 200 Å.

Figure 8E:
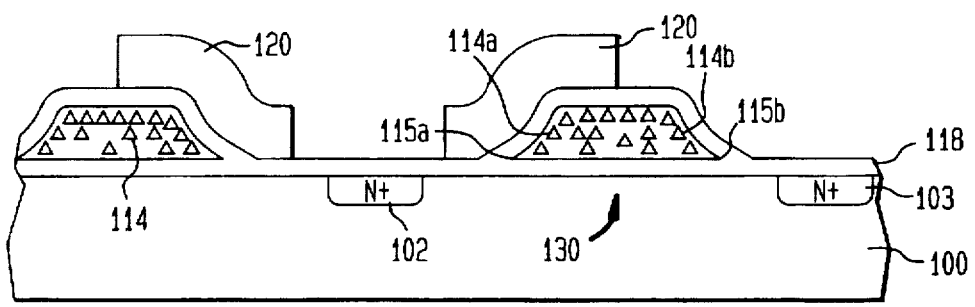

In step (e) shown in FIG. 8(e), a second poly silicon layer is formed on the surface of the poly oxide layer 118. Illustratively, the second poly silicon layer has a thickness of 1500 to 2000 Å and is doped N⁺ with arsenic As and/or phosporous P a concentration of about $10^{21}$ to $10^{22}$. The second poly silicon layer is then patterned using a photo-lithographic technique to form poly silicon regions 120. As shown, each poly silicon region 120 is formed so that it partially covers a corresponding poly silicon region 114, including the point 115a, sloped edge 114a, and a portion of the substrate between the drain 102 and the poly silicon region 114.

The poly silicon region 114 forms a poly silicon floating gate over a channel 130 between the source 103 and drain 102. The poly silicon region 120 forms a select gate. Illustratively, the select gate 120 is connected to an appropriate word line (not shown) and the source 103 is connected to an appropriate bit line (not shown). As is conventional, a particular cell may be accessed by applying an appropriate voltage to the cell's corresponding word line and by detecting or applying a voltage to the cell's corresponding bit line.

Figure 4:
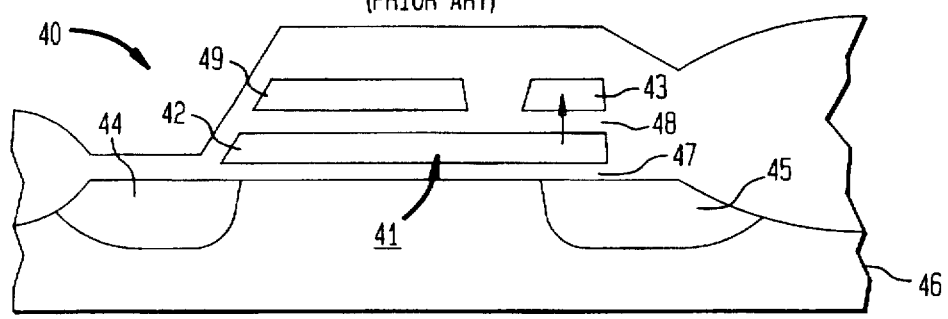
FIG. 4 shows a conventional Thinox-Tex cell.
Figure 5:
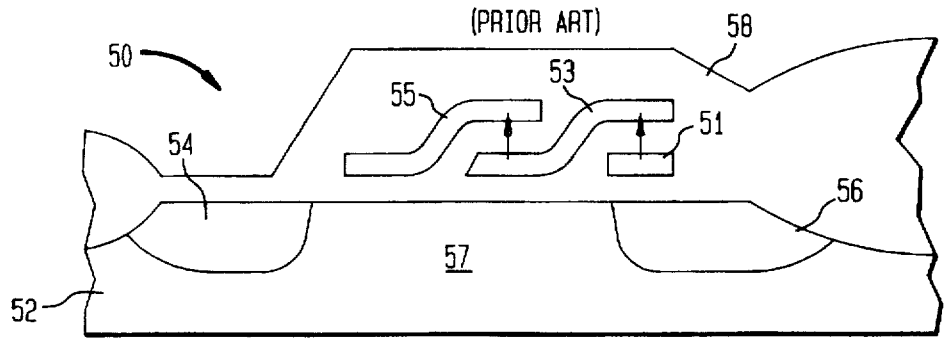
FIG. 5 shows a conventional TPFG cell.
Figure 6:
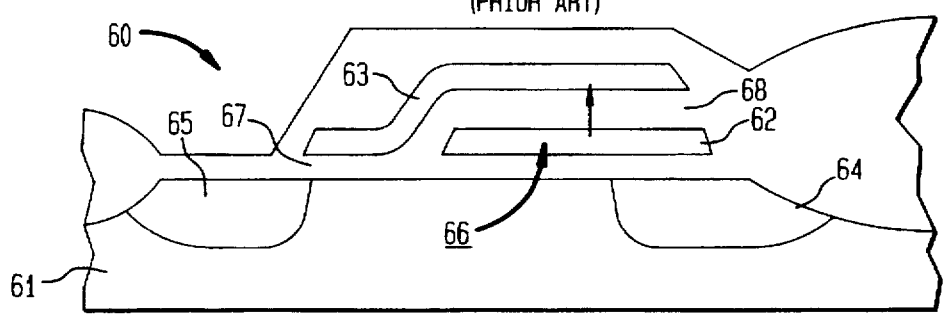
FIG. 6 shows a conventional CHE-Tex cell.
Figure 7:
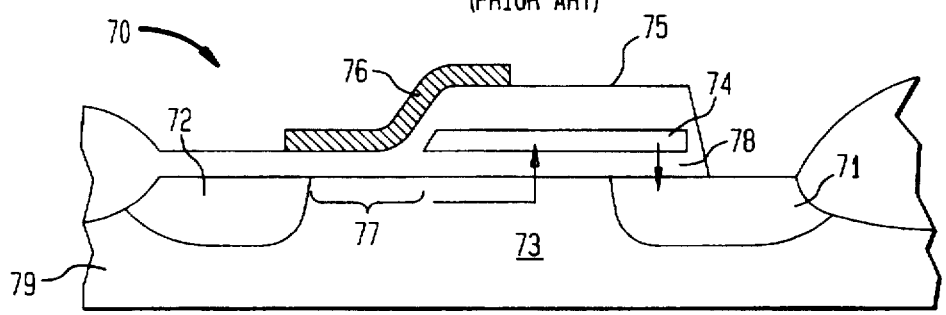
FIG. 7 shows a conventional PACMOS cell.
Figure 9:
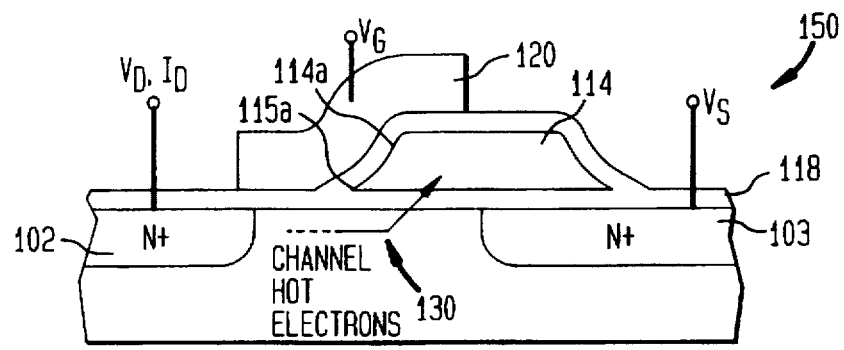
FIG. 9 illustrates the writing of data to an E²PROM cell according to a second embodiment of the present invention.

The writing operation of the E²PROM cell 150 is illustrated in FIG. 9. Illustratively, writing is achieved using the perpendicularly accelerating channel injection technique. A 0.5 volt drain voltage $V_d$ is applied to the drain 102. A 2 volt gate voltage $V_g$ is applied to the select gate 120 via the cell's corresponding word line. Furthermore, a 12 volt source voltage $V_s$ is applied to the source 103 via the cell's 150 corresponding bit line. The source voltage $V_s$ induces a voltage in the floating gate 114. This causes a strong potential drop at the center of the channel 130 where neither the select gate 120 nor the floating gate 114 are controlling the channel 130. As a result, channel hot electrons generated in the channel 130 near the drain region are injected into the floating gate 114 with a high efficiency of $10^{-3}$. The drain current $I_d$ is low, i.e., typically around 30 to 150 μA. Thus, low power is used in the writing operation. The time required for performing the write operation is less than or equal to 100 μs, whereas the conventional cells shown in FIG. 4 require a time of 100 μs.

Figure 10:
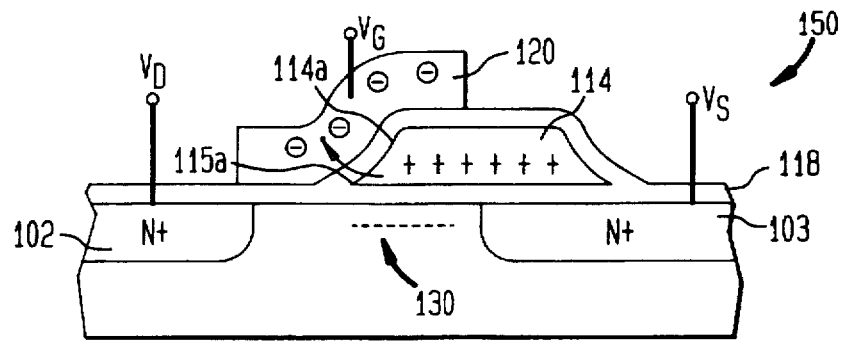
FIG. 10 illustrates the erasing of an E²PROM cell according to a third embodiment of the present invention.

The erase operation of the E²PROM cell 150 is illustrated in FIG. 10. A zero volt drain voltage $V_d$ is applied to the drain 102 and a zero volt source voltage $V_s$ is applied to the source 103 via the corresponding bit line. A 15 volt control voltage $V_g$ is applied to the select gate 120 via the corresponding word line. As a result, electrons stored in the floating gate 114 tunnel from the sloped edge 114a, in particular, the point 115a, of the floating gate 114 to the select gate 120 according to the enhanced FN tunnelling effect. Since enhanced FN tunnelling is used, the poly oxide may be thicker than a comparable thin oxide (for FN tunnelling). The voltage required for performing the erase is 12 volts, which is lower than the voltage of 20 volts required by the prior art devices of FIG. 4. The reduced voltage results from high field injection due to sharp profile of the edges 115a, 115b.

Moreover, the shape of the pointed, sloped edge 115a–114a from which the electrons tunnel reduces the susceptibility of the poly oxide 118 to wearing out. Electrons which are stored in the floating gate 114 tend to accumulate at the point 115a. Thus, during the erase operation, the electrons tend to tunnel from only a small surface area in the vicinity of the point 115a. As such, the electrons do not flow tangentially across the interface between the poly silicon floating gate 114 and the poly oxide 118. Such tangential electron flow is perpendicular to the asperities of the poly silicon floating gate 114 at the interface and therefore causes the poly oxide 118 to wear out. Therefore, by reducing the tangential electron flow, the poly oxide 118 is less susceptible to wearing out.

To perform a read operation with the E²PROM cell 150, a 4 volt control voltage $V_g$ is applied to the control gate 120 via the corresponding word line. A 2 volt drain voltage $V_d$ is applied to the drain. The source voltage $V_s$ is then detected via the appropriate bit line to determine whether or not charge is stored on the floating gate 114 (indicating that a logic '1' or logic '0' bit is stored in the cell 150).

The E²PROM cell 150 is simple, has a small size, scales easily and requires a low power. Furthermore, only a 5 volt power supply is needed to read information from the cell 150. Moreover, because erasing is achieved by enhanced FN tunnelling from the pointed sloped edge of the floating poly gate, the poly oxide separating the floating gate from the select gate is less susceptible to wearing out. The E²PROM cell 150 thus has a greater erase endurance.

Finally, the above-discussion is intended to be merely illustrative. Numerous other embodiments and equivalent structures may be devised by those having ordinary skill in the art.

I claim:

1. An E²PROM cell comprising:

a poly silicon floating gate substantially entirely disposed on a gate oxide formed above a substrate, the floating gate having a pointed, bird's beak shaped edge, a poly oxide disposed on said pointed, bird's beak shaped edge of said poly floating gate, a select gate disposed on said poly oxide and overlapping only a part of said floating gate including said pointed, bird's beak shaped edge, and a channel in a vicinity of said floating gate;

wherein said pointed, curved edge of said poly floating gate, said poly oxide, and said select gate cooperate to erase the floating gate in a manner that electrons tunnel from said pointed, bird's beak shaped edge of said floating gate to said select gate, and to write into the floating gate by injecting channel hot electrons from said channel into said floating gate, and wherein the area between said floating gate and said select gate being less than the area between said floating gate and said substrate.

2. The E²PROM cell of claim 1 wherein said electrons tunnel according to enhanced Fowler Nordheim tunnelling.

3. The E²PROM cell of claim 2 wherein said select gate overlaps a portion of said channel, and wherein a voltage applied by said select gate and a voltage applied by said floating gate over a portion of said channel increase an injection efficiency of said channel hot electrons.

4. The E²PROM cell of claim 2 further comprising:

self aligned source and drain regions disposed on opposite sides of said channel, said source region being disposed so that said floating gate overlaps said source region.

5. The E²PROM cell of claim 1 wherein electrons stored in said floating gate accumulate at a point of said pointed, sloped edge of said floating gate so as to reduce tangential electron flow across an interface between said floating gate and said poly oxide during tunnelling.

6. The E²PROM cell of claim 5 wherein wearing out of said poly oxide is reduced by said reduced tangential electron flow across said interface.

7. The E²PROM cell of claim 6 wherein during a write operation, a first voltage is applied to said drain region, a second voltage is applied to said select gate and a third voltage is applied to said source region, which third voltage induces a voltage in said floating gate, to generate channel hot electrons in a portion of said channel near said drain region and for injecting said channel hot electrons into said floating gate.

8. The E²PROM cell of claim 6 wherein during an erase operation, a zero voltage is applied to said drain and said source regions, and a first voltage is applied to said select gate, so that electrons stored in said floating gate tunnel from said pointed, sloped edge of said floating gate to said select gate.

9. The E²PROM cell of claim 6 wherein during a read operation, a first voltage is applied to said drain region and a second voltage is applied to said select gate so that a voltage induced in said source region by electrons stored in said floating gate may be detected.

* * * * *